US008513606B2

(12) United States Patent
Oda

(10) Patent No.: US 8,513,606 B2
(45) Date of Patent: Aug. 20, 2013

(54) THZ WAVE DETECTOR

(75) Inventor: Naoki Oda, Tokyo (JP)

(73) Assignee: NEC Corporation, Tokyo (JP)

( * ) Notice: Subject to any disclaimer, the term of this patent is extended or adjusted under 35 U.S.C. 154(b) by 495 days.

(21) Appl. No.: 12/904,877

(22) Filed: Oct. 14, 2010

(65) Prior Publication Data
US 2011/0108729 A1 May 12, 2011

(30) Foreign Application Priority Data

Nov. 12, 2009 (JP) .................................. 2009-258923

(51) Int. Cl.
*G01J 5/00* (2006.01)

(52) U.S. Cl.
USPC ............... 250/339.04; 250/338.4; 250/338.3; 250/338.1; 250/340

(58) Field of Classification Search
USPC .................................................... 250/339.04
See application file for complete search history.

(56) References Cited

U.S. PATENT DOCUMENTS

| 5,144,149 A * | 9/1992 | Frosch ...................... 250/493.1 |
| 5,286,976 A | 2/1994 | Cole |
| 5,288,649 A * | 2/1994 | Keenan ............................ 438/54 |
| 7,557,349 B2 * | 7/2009 | Oda et al. ................... 250/341.1 |
| 8,215,832 B2 * | 7/2012 | Kurashina ..................... 374/133 |
| 2003/0141453 A1 * | 7/2003 | Reed et al. ................. 250/338.1 |
| 2004/0200962 A1 * | 10/2004 | Ishikawa et al. ......... 250/339.04 |
| 2006/0231761 A1 * | 10/2006 | Peytavit et al. ............ 250/338.1 |
| 2009/0015491 A1 * | 1/2009 | Ikeda et al. .................... 343/703 |
| 2011/0057107 A1 * | 3/2011 | Agnese et al. ............. 250/338.3 |

FOREIGN PATENT DOCUMENTS

JP 2008-241438 A 10/2008

OTHER PUBLICATIONS

Rub et al., The geometric design of microbolometer elements for uncooled focal plane arrays, Proc. of SPIE vol. 6542, 2007.*
N. Oda et al., "Detection of terahertz radiation from quantum cascade laser, using vanadium oxide microbolometer focal plane arrays", Proceedings of SPIE, vol. 6940, 2008, pp. 69402Y-1~12.
J-L. Tissot et al., "LETI/LIR's Amorphous Silicon Uncooled Microbolometer Development", Proceedings of SPIE, vol. 3379, 1998, pp. 139-144.

* cited by examiner

*Primary Examiner* — David Porta
*Assistant Examiner* — Djura Malevic

(57) ABSTRACT

A THz wave detector including a thermal isolation structure in which a supporting unit containing electrode wirings connected to a readout circuit formed in an substrate supports a temperature detecting unit connected to the electrode wirings so that one face of said temperature detecting unit and said substrate are opposed to each other with a predetermined gap, wherein a reflective film reflecting THz waves is formed on the substrate so as to face the temperature detecting unit, an absorbing film absorbing the THz waves is formed on the temperature detecting unit, the reflective film and the temperature detecting unit form an optical resonant structure, the distance between the reflective film and the temperature detecting unit is set to 8 to 14 μm, and the sheet resistance of the absorbing film is set to 100 to 200 Ω/square.

14 Claims, 13 Drawing Sheets

THZ WAVE DETECTOR

This application is based on Japanese Patent Application No. 2009-258923 filed on Nov. 12, 2009 and including specification, claims, drawings and summary. The disclosure of the above Japanese Patent Application is incorporated herein by reference in its entirety.

TECHNICAL FIELD

The present invention relates to a THz wave detector detecting electromagnetic waves in the THz frequency band (THz waves).

BACKGROUND ART

Recently, electromagnetic waves in the THz frequency band between light and radio waves (namely the electromagnetic waves at a frequency of $10^{12}$ Hz and in a wavelength range approximately from 30 μm to 1 mm, which are termed the THz waves hereafter) have drawn attention as electromagnetic waves directly reflecting substance information. Techniques of bolometer-type infrared detectors having thermal isolation structures are applied to detection of the THz waves. Bolometer-type THz wave detectors are among the related art and described in Unexamined Japanese Patent Application KOKAI Publication No. 2008-241438 and a SPIE Paper (Oda et al., Proceedings of SPIE, Vol. 6940 (2008) pp. 69402Y-1 to 69402Y-12). There are many bolometer-type infrared detector-related techniques. Among them, technical matters relating to the thermal isolation structure, which is in frequent use, are described in U.S. Pat. No. 5,286,976 and a SPIE Paper (J-L. Tissot et al., Proceedings of SPIE, Vol. 3379 (1998) pp. 139-144).

However, in the pixel structure of related art in Unexamined Japanese Patent Application KOKAI Publication No. 2008-241438, since the distance between the reflective film and temperature detecting unit is set based on the infrared wavelengths and the sheet resistance of the temperature detecting unit is set based on the THz waves, the thermal isolation structure having an absorbing film has an absorptance of approximately 18 to 40% for a wavelength of 100 μm. For other wavelengths, the formula in the SPIE Paper (Oda et al., Proceedings of SPIE, Vol. 6940 (2008) pp. 69402Y-1 to 69402Y-12) can be used to calculate the wavelength properties of the absorptance. The results obtained for an air gap of 1.5 μm (FIG. 10) and for an air gap of 2.5 μm (FIG. 11) are shown. As shown in FIG. 10 and FIG. 11, the absorptance is not really high for almost the entire THz wave range. For example, the absorptance is 5 to 10% for a wavelength of 300 μm.

In the pixel structures of other related art (U.S. Pat. No. 5,286,976 and SPIE Paper (J-L. Tissot et al., Proceedings of SPIE, Vol. 3379 (1998) pp. 139-144)), for instance, the air gap height has to be 25 μm in order to maximize the absorptance for an electromagnetic wave of 3 THz (100 μm in wavelength). By applying the air gap height to the formula in the SPIE Paper (Oda et al., Proceedings of SPIE, Vol. 6940 (2008) pp. 69402Y-1 to 69402Y-12), the absorption properties shown in FIG. 12 are obtained. As shown in FIG. 12, the absorptance is improved; however the absorptance around a wavelength of 50 μm is low. Then, it is difficult to realize a THz wave detector that does not lose or extremely diminish the sensitivity around a specific wavelength among the shorter wavelengths including 30 μm or longer in the THz wave range.

SUMMARY

The present invention is made in view of the foregoing circumstance and the exemplary object of the present invention is to provide a highly sensitive THz wave detector.

In order to achieve the exemplary object, a THz wave detector according to a first exemplary aspect of the present invention includes a thermal isolation structure in which a supporting unit containing electrode wirings connected to a readout circuit formed in an substrate supports a temperature detecting unit connected to the electrode wirings so that one face of the temperature detecting unit and the substrate are opposed to each other with a predetermined gap, wherein a reflective film reflecting THz waves is formed on the substrate so as to face the temperature detecting unit, an absorbing film absorbing the THz waves is formed on the temperature detecting unit, the reflective film and the temperature detecting unit form an optical resonant structure, the distance between the reflective film and the temperature detecting unit is set to 8 to 14 μm, and the sheet resistance of the absorbing film is set to 100 to 200 Ω/square.

Furthermore, in order to achieve the exemplary object, a THz wave detector according to a second exemplary aspect of the present invention includes a thermal isolation structure in which a supporting means containing electrode wirings connected to a readout circuit formed in an substrate supports a temperature detecting means connected to the electrode wirings so that one face of the temperature detecting means and the substrate are opposed to each other with a predetermined gap, wherein a reflective means reflecting THz waves is formed on the substrate so as to face the temperature detecting means, an absorbing means absorbing the THz waves is formed on the temperature detecting means, the reflective means and the temperature detecting means form an optical resonant means, the distance between the reflective means and the temperature detecting means is set to 8 to 14 μm, and the sheet resistance of the absorbing means is set to 100 to 200 Ω/square.

Furthermore, in order to achieve the exemplary object, a manufacturing method of a THz wave detector according to a third exemplary aspect of the present invention includes a thermal isolation structure in which a supporting unit containing electrode wirings connected to a readout circuit formed in an substrate supports a temperature detecting unit connected to the electrode wirings so that one face of the temperature detecting unit and the substrate are opposed to each other with a predetermined gap, wherein a reflective film reflecting THz waves is formed on the substrate so as to face the temperature detecting unit, an absorbing film absorbing the THz waves is formed on the temperature detecting unit, the reflective film and the temperature detecting unit form an optical resonant structure, the distance between the reflective film and the temperature detecting unit is set to 8 to 14 μm, and the sheet resistance of the absorbing film is set to 100 to 200 Ω/square.

BRIEF DESCRIPTION OF THE DRAWINGS

These objects and other objects and advantages of the present invention will become more apparent upon reading of the following detailed description and the accompanying drawings in which.

EXEMPLARY EMBODIMENT

Figure 1:
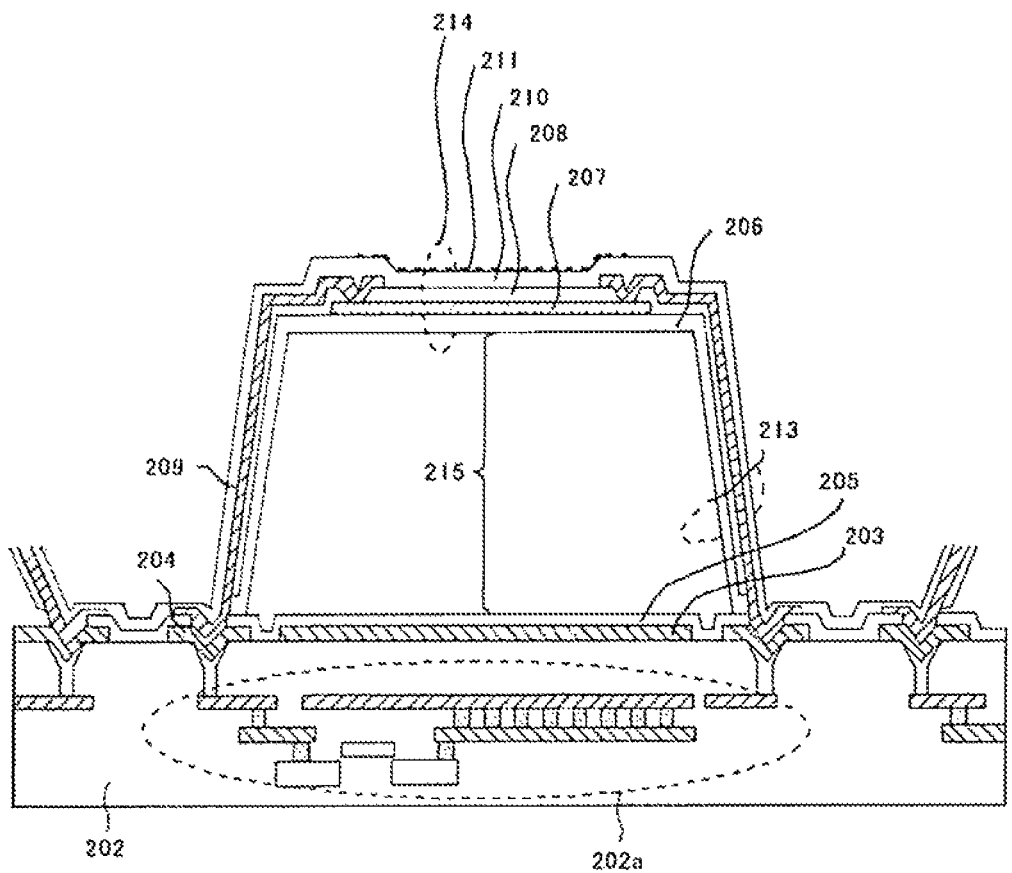
FIG. 1 A cross-sectional view showing the pixel structure of a bolometer-type THz wave detector according to an exemplary embodiment of the present invention.

The inventor of the present invention proposed in Unexamined Japanese Patent Application KOKAI Publication No. 2008-241438 a THz wave detector detecting THz waves (terahertz waves) at a frequency of $10^{12}$ Hz and in a wavelength range approximately from 30 μM to 1 mm. However, in the THz wave detector described in the Unexamined Japanese Patent Application KOKAI Publication No. 2008-241438, the distance between the reflective film and the temperature detecting unit is set based on the wavelengths of infrared light and the sheet resistance of the temperature detecting unit is set based on the THz waves, whereby it is not so easy to improve the THz wave absorptance.

In an infrared detector, the height of the air gap is set to a quarter of a wavelength to be detected and the sheet resistance of the metal thin film of the uppermost layer serving for absorbing infrared light is matched with the vacuum impedance of 377 Ω/square so as to improve the infrared absorptance (U.S. Pat. No. 5,286,976 and SPIE Paper (J-L. Tissot et al., Proceedings of SPIE, Vol. 3379 (1998) pp. 139-144). This method was considered to be applicable to a THz wave detector for improving the THz wave absorptance.

However, review by the inventor of the present invention found that the sensitivity is not really high around a specific wavelength among the shorter wavelengths in the THz wave range when the air gap is 25 μm in accordance with the THz waves in the pixel structures of related art.

The above phenomenon occurs presumably because the THz wave absorptance is largely dependent both on the air gap height and on the sheet resistance of the absorbing film. Then, the inventor of the present invention investigated the THz wave absorptance using the air gap height and the sheet resistance of the absorbing film as parameters, and found that a highly sensitive bolometer-type THz wave detector which does not diminish the sensitivity around a specific wavelength among the shorter wavelengths in the THz wave range can be realized by setting the distance between the reflective film and the temperature detecting unit (the absorbing film) and the distance between the reflective film and the canopy to 8 to 14 μm respectively and setting the sheet resistance of the absorbing film on the temperature detecting unit to 100 to 200 Ω/square. Detailed explanation will be made hereafter with reference to the drawings.

In this specification, the air gap refers to the space in an optical resonant structure and, in the drawings, the distance between the reflective film and the temperature detecting unit. More precisely, it is the distance between the reflective film and the center of the temperature detecting unit in the thickness direction thereof and, actually, the distance between the reflective film and the absorbing film because the absorbing film is dominant.

Figure 2:
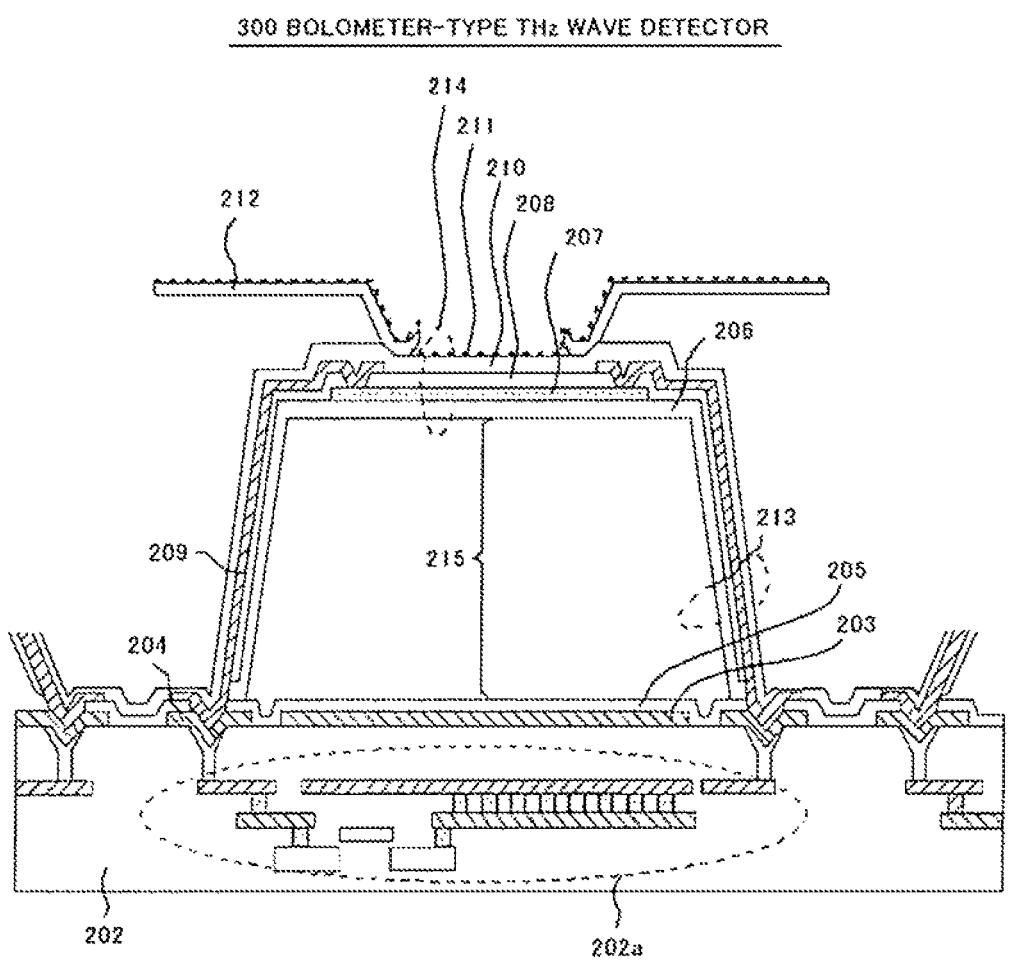
FIG. 2 A cross-sectional view showing the pixel structure (with a canopy) of a bolometer-type THz wave detector according to an exemplary embodiment of the present invention.
Figure 3:
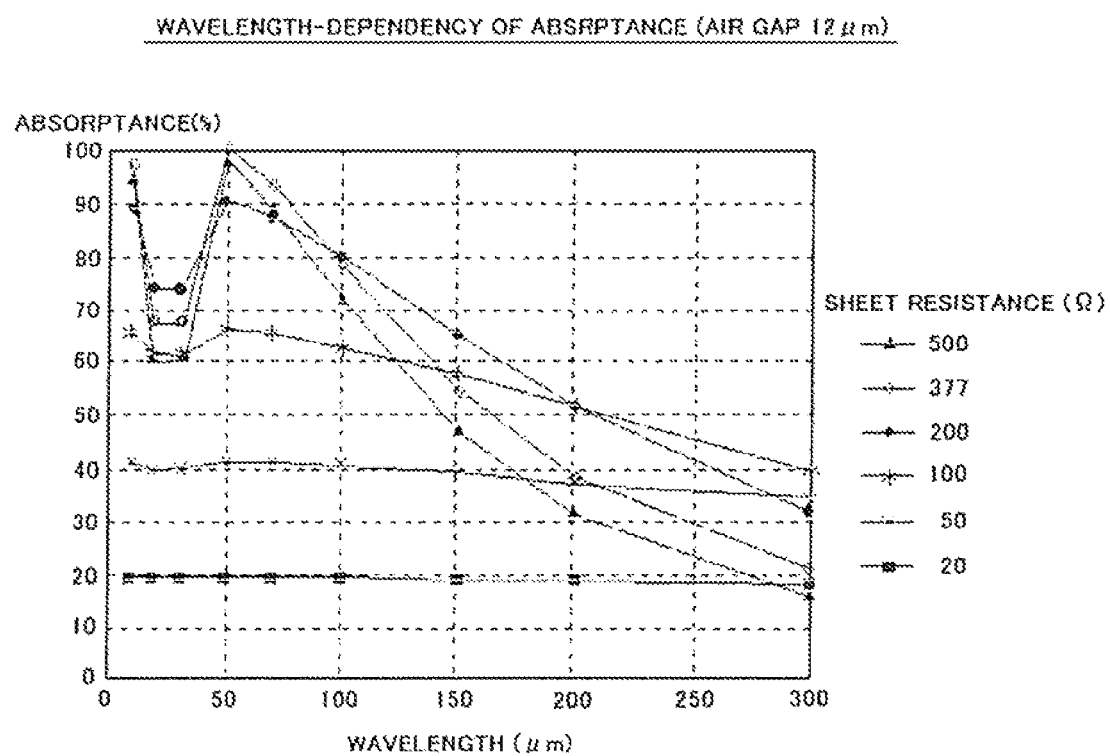
FIG. 3 A graphical representation showing the wavelength dependency of the absorptance of a bolometer-type THz wave detector according to an exemplary embodiment of the present invention (when the air gap is 12 μm)
Figure 4:
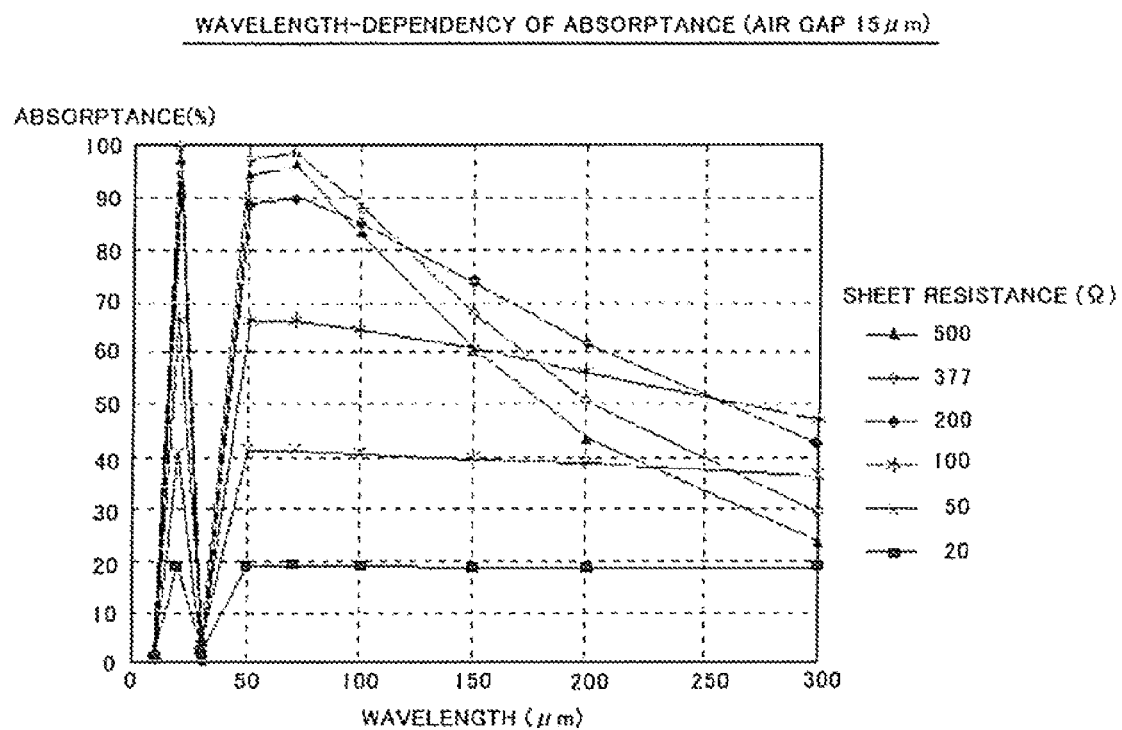
FIG. 4 A graphical representation showing the wavelength dependency of the absorptance of a bolometer-type THz wave detector according to an exemplary embodiment of the present invention (when the air gap is 15 μm)
Figure 5:
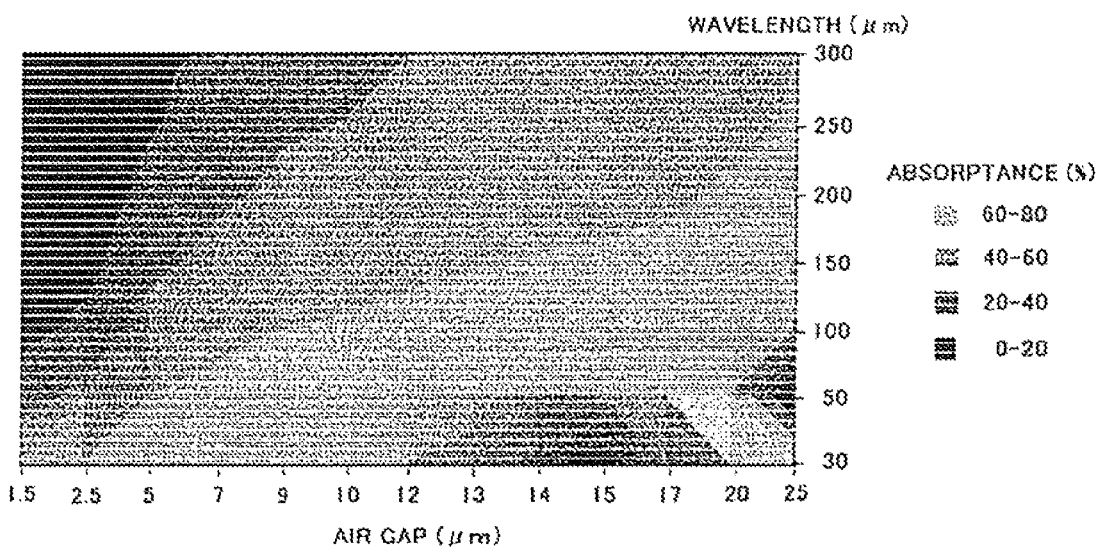
FIG. 5 A diagram showing the absorptance dependency between the air gap and wavelength of a bolometer-type THz wave detector according to an exemplary embodiment of the present invention (when the sheet resistance is 100Ω)
Figure 6:
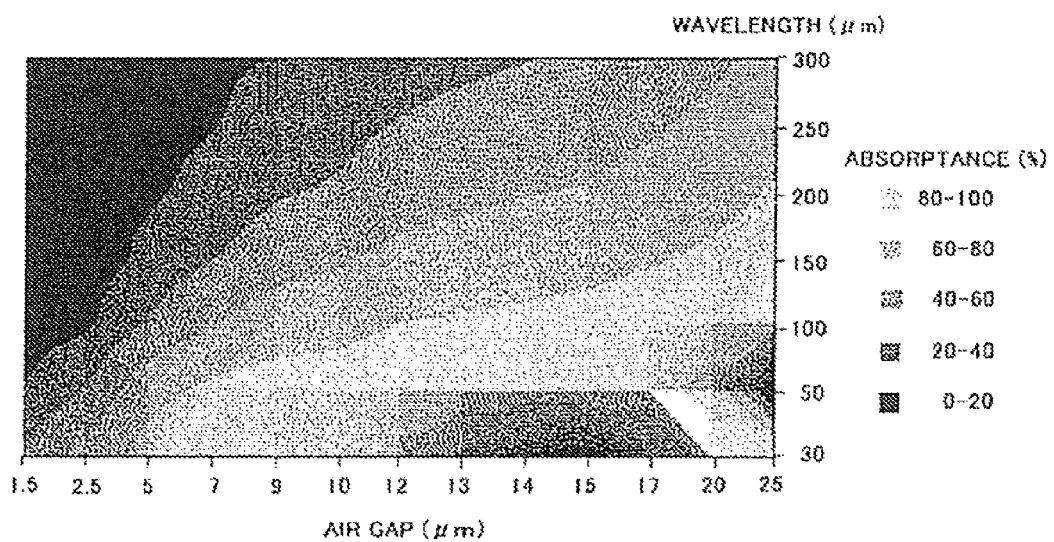
FIG. 6 A diagram showing the absorptance dependency between the air gap and wavelength of a bolometer-type THz wave detector according to an exemplary embodiment of the present invention (when the sheet resistance is 200Ω)
Figure 13:
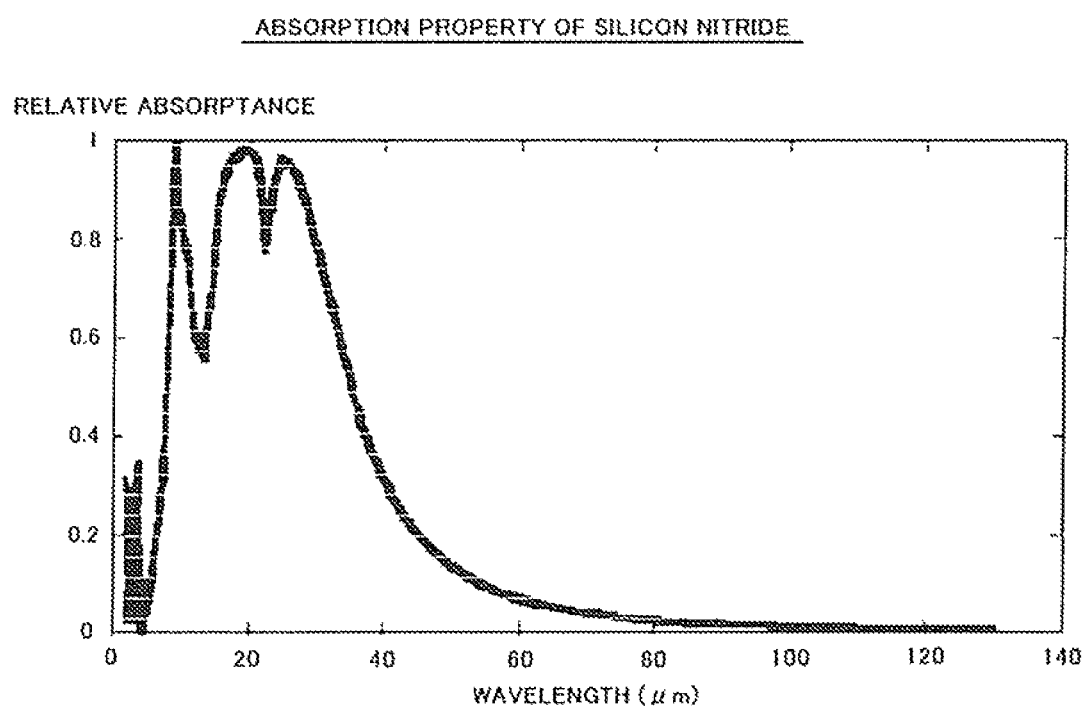
FIG. 13 A graphical representation showing the absorption properties of silicon nitride.

A bolometer-type THz wave detector having a thermal isolation structure according to an exemplary embodiment of the present invention will be described with reference to FIGS. 1, 2, 3, 4, 5, 6, and 13. FIG. 1 is a cross-sectional view showing the pixel structure of a bolometer-type THz wave detector 200 of this embodiment. FIG. 2 is a cross-sectional view showing the pixel structure of a bolometer-type THz wave detector 300 with a canopy. FIG. 3 shows the wavelength dependency of the THz wave absorptance of the bolometer-type THz wave detector 200 and the bolometer-type THz wave detector 300 when the air gap is 12 μm. FIG. 4 shows the wavelength dependency of the THz wave absorptance of the bolometer-type THz wave detector 200 and the bolometer-type THz wave detector 300 when the air gap is 15 μm. FIG. 5 shows the absorptance dependency between the air gap and the wavelength of the bolometer-type THz wave detector 200 and the bolometer-type THz wave detector 300 when the sheet resistance of the absorbing film is 100Ω. FIG. 6 shows the absorptance dependency between the air gap and the wavelength of the bolometer-type THz wave detector 200 and the bolometer-type THz wave detector 300 when the sheet resistance of the absorbing film is 200Ω. FIG. 13 shows the THz wave absorptance of silicon nitride.

As shown in FIG. 1, the bolometer-type THz wave detector 200 has a circuit substrate 202 in which a readout circuit 202a and so on are formed. A reflective film 203 reflecting incident THz waves and contacts 204 for connection to the readout circuit 202a are formed on the circuit substrate 202. A first protective film 205 is formed thereon. A supporting unit 213 consisting of a second protective film 206, a third protective film 208, electrode wirings 209, and a fourth protective film 210 is formed on the contacts 204. The readout circuit 202a and the electrode wirings 209 are connected via the contacts 204. The supporting unit 213 holds a temperature detecting unit 214 (diaphragm) consisting of the second protective film 206, a bolometer thin film 207, the third protective film 208, a fourth protective film 210, and an absorbing film 211 in the air (the temperature detecting unit 214 is supported in a suspended manner above the circuit substrate 202.) so that an air gap 215 is formed (That is to say, one face of the temperature detecting unit 214 and the circuit substrate 202 are opposed to each other with the predetermined air gap 215). In other words, the reflective film 203 and the temperature detecting unit 214 constitute an optical resonant structure. The electrode wirings 209 are connected to the both ends of the bolometer thin film 207. The reflective film 203 faces the temperature detecting unit 214. The absorbing film 211 absorbs the THz waves reflected by the reflective film 203. The absorbing film 211 is formed on the fourth protective film 210 to cover the top surface of the temperature detecting unit 214.

As shown in FIG. 2, the bolometer-type THz wave detector 300 has a circuit substrate 202 in which a readout circuit 202a and so on are formed. A reflective film 203 reflecting incident THz waves and contacts 204 for connection to the readout circuit 202a are formed on the circuit substrate 202. A first protective film 205 is formed thereon. A supporting unit 213 consisting of a second protective film 206, a third protective film 208, electrode wirings 209, and a fourth protective film 210 is formed on the contacts 204. The readout circuit 202a and the electrode wirings 209 are connected via the contacts 204. The supporting unit 213 holds a temperature detecting unit 214 (diaphragm) consisting of the second protective film 206, a bolometer thin film 207, the third protective film 208, a fourth protective film 210, and an absorbing film 211 in the air (the temperature detecting unit 214 is supported in a suspended manner above the circuit substrate 202) so that an air gap 215 is formed (That is to say, one face of the temperature detecting unit 214 and the circuit substrate 202 are opposed to each other with the predetermined air gap 215). In other words, the reflective film 203 and the temperature detecting unit 214 constitute an optical resonant structure. The electrode wirings 209 are connected to the both ends of the bolometer thin film 207. A canopy 212 extends outward from the periphery (edge) of the temperature detecting unit 214 so that THz waves entering around the temperature detecting unit 214 are absorbed. The reflective film 203 faces the temperature detecting unit 214. The absorbing film 211 absorbs the THz waves reflected by the reflective film 203. The absorbing film 211 is formed on the fourth protective film 210 to cover the top surfaces of the temperature detecting unit 214 and the canopy 212.

Figure 7:
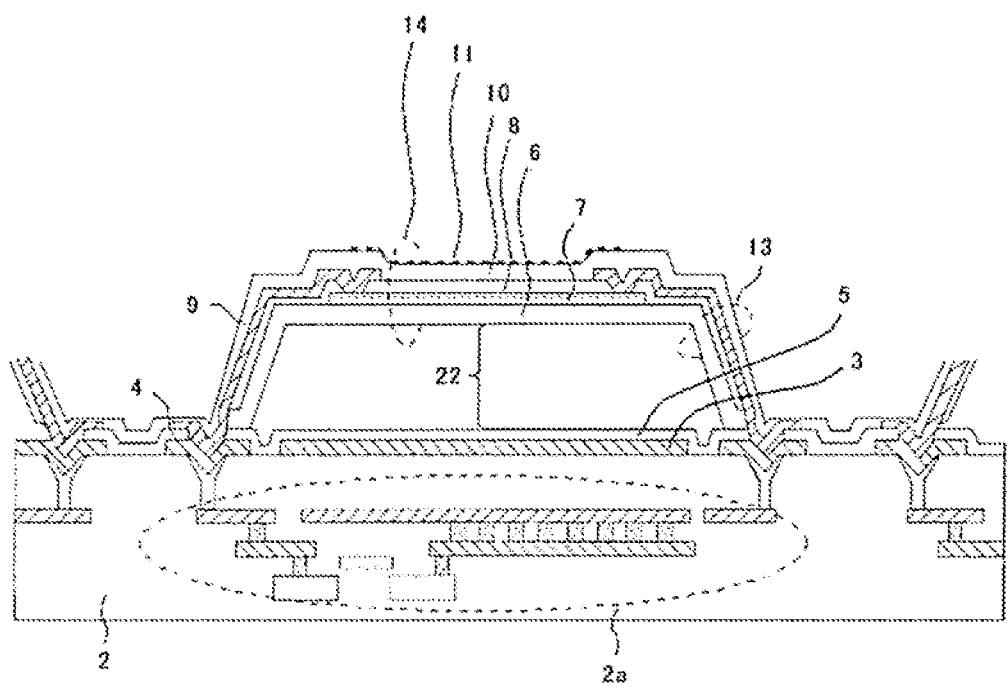
FIG. 7 A cross-sectional view showing the pixel structure of a bolometer-type THz wave detector of related art.
Figure 8:
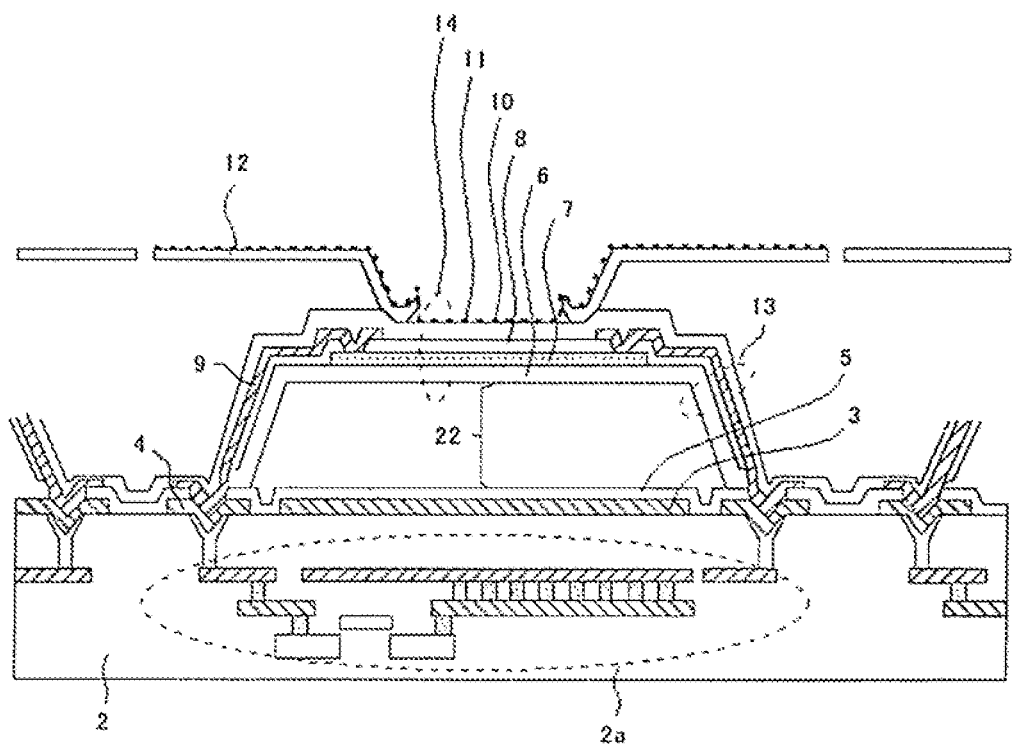
FIG. 8 A cross-sectional view showing the pixel structure (with a canopy) of a bolometer-type THz wave detector of related art.

The bolometer-type THz wave detector 200 and the bolometer-type THz wave detector 300 of this embodiment shown in FIG. 1 and FIG. 2 respectively are different from a bolometer-type THz wave detector of related art as shown in FIG. 7 and FIG. 8 described later in the distance between the reflective film and the temperature detecting unit (absorbing film), the distance between the reflective film and the canopy, and the sheet resistance of the absorbing film formed on the temperature detecting unit and the canopy.

The bolometer-type THz wave detector 200 in FIG. 1 employs an uncooled bolometer-type array sensor having 320×240 pixels and a pixel pitch of 37 µm. The second protective film 206, the third protective film 208, and the fourth protective film 210 are made of silicon nitride. The total thickness of the second protective film 206, the third protective film 208, and the fourth protective film 210 is 700 nm. The bolometer thin film 207 is made of a vanadium oxide thin film of 60 nm in thickness. The electrode wirings 209 and the absorbing film 211 are made of TiAlV. The TiAlV of the electrode wirings 209 has a thickness of 70 nm. The TiAlV of the absorbing film 211 has a thickness of 20 nm for a sheet resistance of 100 Ω/square and 10 nm for a sheet resistance of 200 Ω/square.

The bolometer-type THz wave detector 300 in FIG. 2 employs an uncooled bolometer-type array sensor having 320×240 pixels and a pixel pitch of 23.5 µm. The second protective film 206, the third protective film 208, and the fourth protective film 210 are made of silicon nitride. The total thickness of the second protective film 206, the third protective film 208, and the fourth protective film 210 is 350 nm. The canopy 212 is also, made of silicon nitride and has a thickness of 300 nm. The bolometer thin film 207 is made of a vanadium oxide thin film of 60 nm in thickness. The electrode wirings 209 and the absorbing film 211 are made of TiAlV. The TiAlV of the electrode wirings 209 has a thickness of 50 nm. The TiAlV of the absorbing film 211 has a thickness of 20 nm for a sheet resistance of 100 Ω/square and 10 nm for a sheet resistance of 200 Ω/square.

The terahertz wave (THz wave) absorptance of silicon nitride is described in lecture materials of Q. Hu et al. ("Real-time THz Imaging Using Quantum-cascade Lasers and Focal-plane Array Cameras," 2nd International Workshop on Quantum Cascade Lasers, Sep. 6-9 (2006)), which is shown in FIG. 13. As shown in FIG. 13, silicon nitride is nearly transparent for wavelengths of 50 µm and longer. Therefore, in this wavelength range, the formula in the SPIE paper (Oda et al., Proceedings of SPIE, Vol. 6940 (2008) pp. 69402Y-1 to 69402Y-12) can be used to calculate the THz wave absorptance of the thermal isolation structure of the bolometer-type THz wave detector 200 and the bolometer-type THz wave detector 300 of this embodiment. Since silicon nitride itself absorbs THz waves having wavelengths of 50 µm and shorter at high rates, it should be considered that it is the THz wave absorption of silicon nitride itself, which is a major structural material of the temperature detecting unit, not the THz wave absorption due to interference effect.

FIG. 3 shows the THz wave absorption properties of the thermal isolation structure when the air gap is 12 µm. As shown in FIG. 3, the sensitivity is not lost or extremely diminished around a specific wavelength in the THz wavelength range of 30 µm and longer. When the sheet resistance is low such as 20 Ω/square or 50 Ω/square, the THz wave absorption property is flat but low in value.

FIG. 4 shows the THz wave absorption properties of the thermal isolation structure when the air gap is 15 µm. As shown in FIG. 4, the THz wave absorptance for a wavelength of 30 µm is low. However, when the protective films (the second protective film 206, the third protective film 208, and the fourth protective film 210) of the temperature detecting unit 214 and the canopy 212 are made of silicon nitride, the silicon nitride itself absorbs THz waves having wavelengths of 40 µm and shorter at high rates; therefore, the THz wave absorptance does not extremely drop as in FIG. 4. When the sheet resistance is low such as 20 Ω/square or 50 Ω/square, the THz wave absorption properties are flat but low in value as in FIG. 3.

Judging from FIG. 3 and FIG. 4, when the sheet resistance is approximately 100 Ω/square to 200 Ω/square, the THz wave absorptance is dependent on the wavelength but does not drop as much as when the sheet resistance is 377 Ω/square or 500 Ω/square. Furthermore, the THz wave absorptance is sufficiently high compared with when the sheet resistance is 20 Ω/square or 50 Ω/square. Therefore, the sheet resistance of the absorbing film 211 is preferably 100 Ω/square to 200 Ω/square.

Then, the THz wave absorption properties are obtained using the air gap as a parameter when the sheet resistance of the absorbing film is 100 Ω/square and 200 Ω/square. The THz wave absorptance is presented in contour on a diagram having the air gap as horizontal axis and the wavelength as vertical axis. FIG. 5 and FIG. 6 show the results. The height of the air gap was changed between 1.5 µm and 25 µm and the wavelength was changed between 30 µm (10 THz) and 300

μm (1 THz). FIG. 5 shows the case in which the sheet resistance was 100 Ω/square and FIG. 6 shows the case in which the sheet resistance was 200 Ω/square. The THz wave absorptance between 100 Ω/square and 200 Ω/square can be deduced from the results in FIG. 5 and FIG. 6.

In FIG. 5 and FIG. 6, when the minimum THz wave absorptance of the thermal isolation structure of the bolometer-type THz wave detector 200 and the bolometer-type THz wave detector 300 of this embodiment is set to 20% so that the minimum THz wave absorptance is higher than that in the related art (Unexamined Japanese Patent Application KOKAI Publication No. 2008-241438), the height of the air gap realizing a THz wave absorptance of 20% or higher is 8 to 14 μm (the range not including the zones shaded in black in the figures).

As described above, when the protective films (the second protective film 206, the third protective film 208, and the fourth protective film 210) of the temperature detecting unit and the canopy 212 are made of silicon nitride, the silicon nitride itself absorbs THz waves having wavelengths of 40 μm and shorter at high rates; therefore, the THz wave absorptance does not drop so much around a wavelength of 30 μm as in FIG. 5 and FIG. 6. Then, the upper limit of the air gap size can be set to a slightly larger value. However, the manufacturing process becomes slightly difficult as the air gap size is increased; therefore, collective judgment is preferable.

As described above, the dependency of THz wave absorptance on wavelength was examined using the sheet resistance of the absorbing film as a parameter and the range of sheet resistance was determined. Then, in that range of sheet resistance, the dependency of THz wave absorptance on the air gap and the wavelength was examined and the range of the air gap 215 was determined. Consequently, it was confirmed that a highly sensitive bolometer-type THz wave detector that prevent diminishing the sensitivity around a specific wavelength among the shorter wavelengths in the THz wave range can be realized by setting the distance between the reflective film 203 and the temperature detecting unit 214 (the absorbing film 211) and the distance between the reflective film 203 and the canopy 212 is 8 to 14 μm respectively and setting the sheet resistance of the absorbing film 211 on the temperature detecting unit 214 to 100 Ω/square to 200 Ω/square.

A manufacturing method of the bolometer-type THz wave detector 200 will be described hereafter.

First, on a circuit substrate 202 in which a readout circuit 202a such as a CMOS circuit is formed, a film of metal such as Al and Ti is formed by sputtering to a thickness of approximately 500 nm and patterned using a resist as a mask to form a reflective film 203 reflecting THz waves entering a temperature detecting unit 214 of each pixel and contacts 204 connecting electrode wirings 209 to the readout circuit 202a. The metal is not restricted to Al and Ti as long as it has a high reflectance to the THz waves and a low electric resistance.

Then, a film of silicon oxide (SiO, SiO$_2$), silicon nitride (SiN, Si$_3$N$_4$), or silicon oxynitride (SiON) or so on is formed on the entire surface of the circuit substrate 202 by plasma CVD to a thickness of approximately 100 to 500 nm to form a first protective film 205 protecting the reflective film 203 and the contacts 204.

Then, an organic film such as a photosensitive polyimide film is applied on the entire surface of the circuit substrate 202, exposed to light and developed to expose the contacts 204 and the region between pixels, and cured at a temperature of approximately 400° C. to form a sacrifice layer for forming a microbridge structure. The thickness of the cured photosensitive polyimide film is set so that the height of the air gap 215 is 8 to 14 μm.

Then, a film of silicon nitride (SiN, Si$_3$N$_4$) is formed on the sacrifice layer by plasma CVD to form a second protective film 206.

Then, vanadium oxide (V$_2$O$_3$, VO$_x$, etc.) is formed on the second protective film 206 by reactive sputtering in an oxygen atmosphere to a thickness of approximately 60 nm and is patterned using a resist as a mask to form a bolometer thin film 207 on the part to be the temperature detecting unit 214. Vanadium oxide is used for the bolometer thin film 207: however, other materials having a high temperature coefficient of resistance (TCR) can be used.

Then, a film of silicon nitride (SiN, Si$_3$N$_4$) is formed by plasma CVD to form a third protective film 208 protecting the bolometer thin film 207. Subsequently, the first protective film 205, the second protective film 206, and the third protective film 208 on the contacts 204 and the third protective film 208 at the ends of the bolometer thin film 207 are removed.

Then, a film of TiAlV is formed by sputtering to a thickness of approximately 50 nm and is patterned using a resist as a mask to form electrode wirings 209. The electrode wirings 209 electrically connect the bolometer thin film 207 and the readout circuit 202a in the circuit substrate 202 via the contacts 204 and serve as a supporting unit 213 supporting the bolometer thin film 207 in the air. The material of the electrode wirings 209 is not restricted to TiAlV and can be other metals such as Al, Cu, Au, Ti, W, and Mo.

Then, a film of silicon nitride (SiN, Si$_3$N$_4$) is formed by plasma CVD to form a fourth protective film 210 protecting the electrode wirings 209.

Then, a film of TiAlV is formed by sputtering and is patterned using a resist as a mask to form an absorbing film 211. The film thickness is set so that the temperature detecting unit 214 (actually the absorbing film 211) has a sheet resistance of 100 Ω/square to 200 Ω/square (the thickness is set as 20 nm for a sheet resistance of 100 Ω/square and is set as 10 nm for a sheet resistance of 200 Ω/square). The absorbing film 211 contributes to efficient absorption of THz waves. The material of the absorbing film 211 is not restricted to TiAlV, either, and can be other metals such as those for the electrode wirings 209.

Then, the second protective film 206, the third protective film 208, and the fourth protective film 210 are partially plasma-etched using a gas mixture of methane monofluoride and oxygen to form a through-hole and expose the polyimide in part in a predetermined region on the sacrifice layer. The sacrifice layer is removed by ashing using O$_2$ gas plasma to complete the bolometer-type THz wave detector 200 having the structure in FIG. 1.

For the bolometer-type THz wave detector 300 having the structure in FIG. 2, as in the bolometer-type THz wave detector 200, a reflective film 203 and contacts 204 are formed on a circuit substrate 202 in which a readout circuit 202a such as a CMOS circuit is formed. A first protective film 205 is formed thereon. A sacrifice layer is formed on the region to be the temperature detecting unit 214. Then, a second protective film 206, a bolometer thin film 207, and a third protective film 208 are formed on the sacrifice layer. The first protective film 205, the second protective film 206, and the third protective film 208 on the contacts 204 and the third protective film 208 at the ends of the bolometer thin film 207 are removed. Then, electrode wirings 209 and a fourth protective film 210 are formed. The total thickness of the second protective film 206, the third protective film 208, and the fourth protective film 210 is approximately 350 nm.

Then, the second protective film 206, the third protective film 208, and the fourth protective film 210 are partially plasma-etched using a gas mixture of methane monofluoride and oxygen to form a through-hole in a predetermined region on the sacrifice layer and expose the polyimide partially.

Then, a photosensitive polyimide is applied on the entire surface of the circuit substrate 202, exposure to light and developed to expose the periphery (edge) of the temperature detecting unit 214, and heat-treated to form a second sacrifice layer in the center part of the temperature detecting unit 214 and the region between adjacent temperature detecting units 214. The thickness of the second sacrifice layer is set so that the distance between the reflective layer 203 and a canopy is 8 μm to 14 μm.

Then, a film of silicon nitride (SiN, $Si_3N_4$) is formed by plasma CVD to a thickness of approximately 350 nm. The above insulating material in the center part of the temperature detecting unit 214 is removed to form a canopy 212.

Then, a film of TiAlV is formed by sputtering and is patterned using a resist as a mask to form an absorbing film 211 in the center part of the temperature detecting unit 214 and on the canopy 212. As in the above bolometer-type THz wave detector 200, the film thickness is set so that the temperature detecting unit 214 (actually the absorbing film 211) has a sheet resistance of 100 Ω/square to 200 Ω/square (the thickness is 20 nm for a sheet resistance of 100 Ω/square and 10 nm for a sheet resistance of 200 Ω/square).

Subsequently, a through-hole is formed in the canopy 212 between adjacent pixels to expose the polyimide partially. The sacrifice layer and the second sacrifice layer are removed by ashing using $O_2$ gas plasma to complete the bolometer-type THz wave detector 300 having the structure in FIG. 2.

Related art will be described hereafter.

FIG. 7 shows the pixel structure of a two-dimensional bolometer-type THz detector of related art. As shown in FIG. 7, a related art bolometer-type THz wave detector 20 has a circuit substrate 2 in which a readout circuit 2a and so on are formed. A reflective film 3 reflecting incident THz waves and contacts 4 for connection to the readout circuit 2a are formed on the circuit substrate 2. A first protective film 5 is formed thereon. A supporting unit 13 consisting of a second protective film 6, a third protective film 8, electrode wirings 9, and a fourth protective film 10 is formed on the contacts 4. The readout circuit 2a and electrode wirings 9 are connected via the contacts 4. The supporting unit 13 holds a temperature detecting unit 14 (diaphragm) consisting of the second protective film 6, a bolometer thin film 7, the third protective film 8, the fourth protective film 10, and an absorbing film 11 in the air so that an air gap 22 is formed. The electrode wirings 9 are connected to the both ends of the bolometer thin film 7.

FIG. 8 shows another example of related art. A bolometer-type THz wave detector 21 has a circuit substrate 2 in which a readout circuit 2a and so on are formed. A reflective film 3 reflecting incident THz waves and contacts 4 for connection to the readout circuit 2a are formed on the circuit substrate 2. A first protective film 5 is formed thereon. A supporting unit 13 consisting of a second protective film 6, a third protective film 8, electrode wirings 9, and a fourth protective film 10 is formed on the contacts 4. The readout circuit 2a and electrode wirings 9 are connected via the contacts 4. The supporting unit 13 holds a temperature detecting unit 14 (diaphragm) consisting of the second protective film 6, a bolometer thin film 7, the third protective film 8, the fourth protective film 10, and an absorbing film 11 in the air so that an air gap 22 is formed. The electrode wirings 9 are connected to the both ends of the bolometer thin film 7. Furthermore, a canopy 12 is formed around the temperature detecting unit 14 so that THz waves entering around the temperature detecting unit 14 are absorbed.

In the above structures of related art, the distance between the reflective film and the temperature detecting unit is set based on the wavelength of infrared light and the sheet resistance of the temperature detecting unit is set to 10 to 100 Ω/square. Therefore, the sensitivity to the THz waves could be improved simply by adding an absorbing film while having the structure of a bolometer-type infrared detector. For example, approximately 6 times higher sensitivity was achieved for 3 THz (100 μm in wavelength) (Oda et al., Proceedings of SPIE, Vol. 6940 (2008) pp. 69402Y-1 to 69402Y-12).

Figure 9:
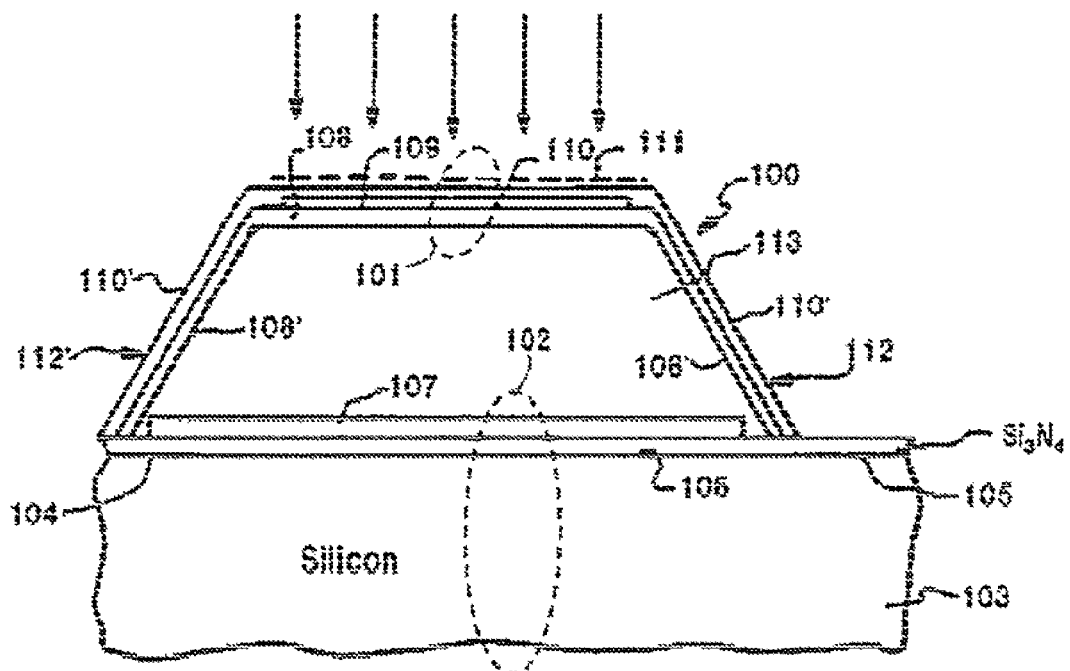
FIG. 9 A cross-sectional view showing the pixel structure of a bolometer-type infrared detector of related art.
Figure 10:
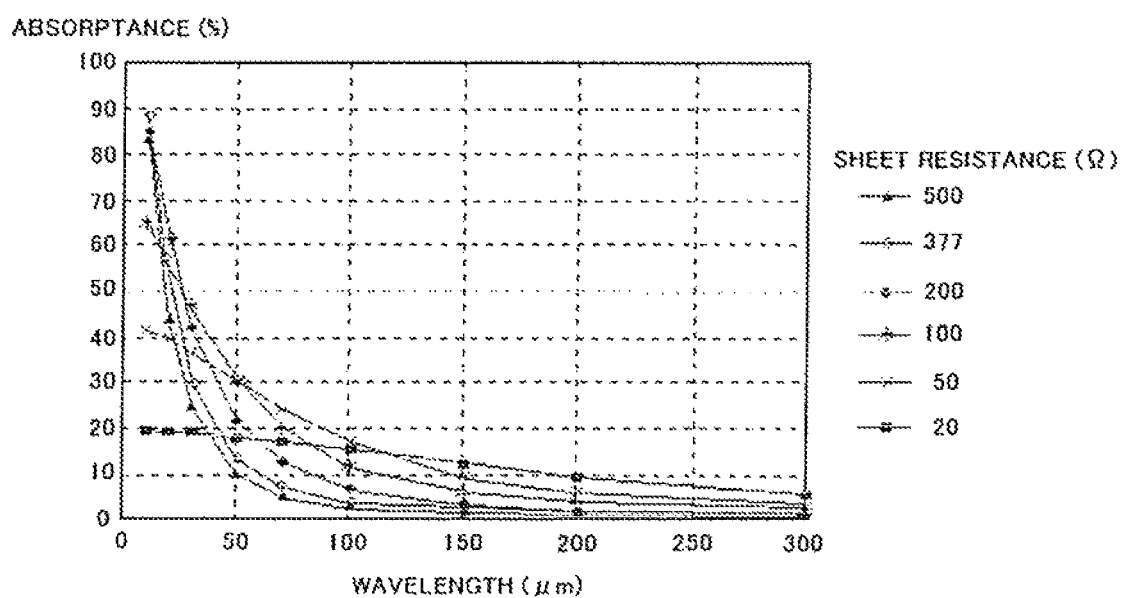
FIG. 10 A graphical representation showing the wavelength dependency of the absorptance of a bolometer-type THz wave detector of related art (when the air gap is 1.5 μm)
Figure 11:
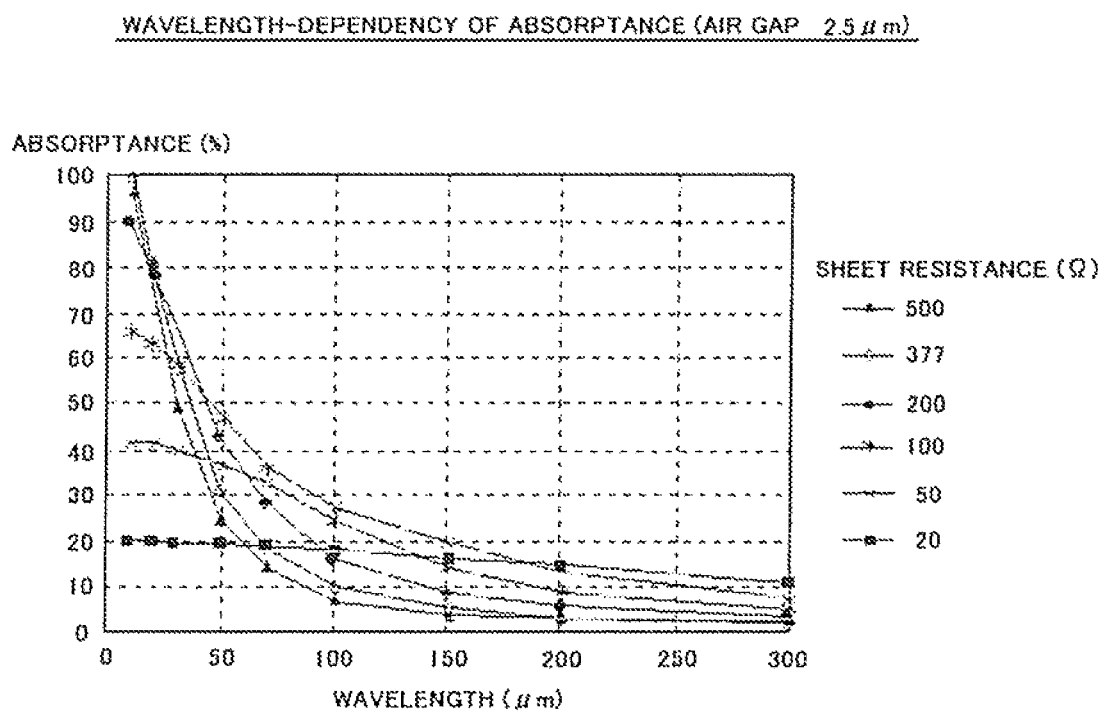
FIG. 11 A graphical representation showing the wavelength dependency of the absorptance of a bolometer-type THz wave detector of related art (when the air gap is 2.5 μm)
Figure 12:
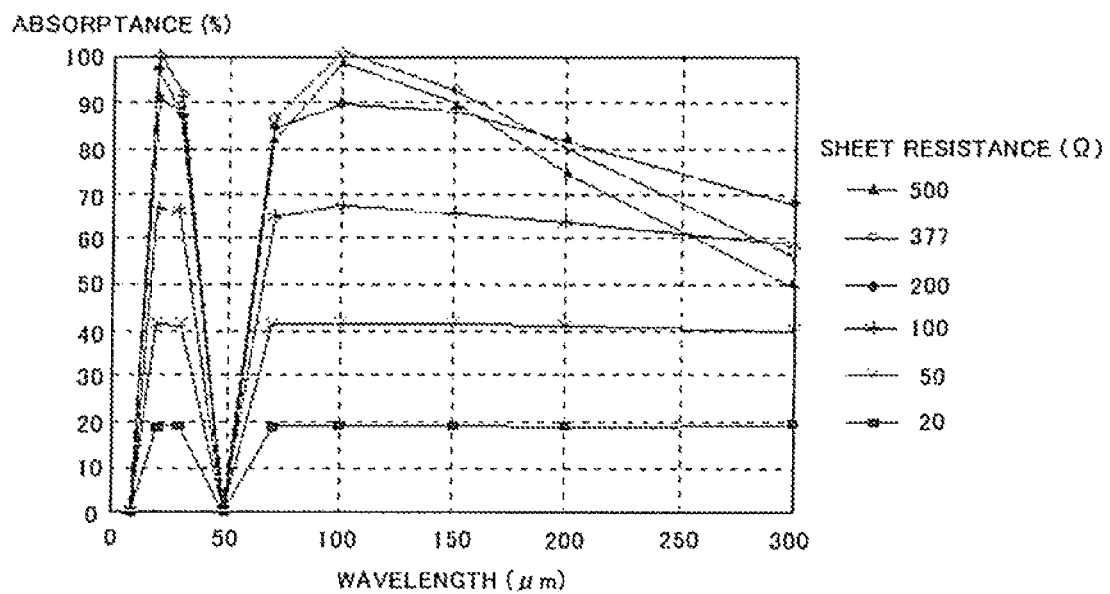
FIG. 12 A graphical representation showing the wavelength dependency of the absorptance of a bolometer-type THz wave detector of related art (when the air gap is 25 μm)

As another example of related art, U.S. Pat. No. 5,286,976 describes a technique to improve the sensitivity in a bolometer-type infrared detector having a thermal isolation structure. FIG. 9 shows a cross-sectional view of a two-level type microbridge bolometer pixel 100. This device 100 has two levels, namely an upper microbridge detector level 101 and a lower level 102. The lower level 102 has a semiconductor substrate 103 having a flat surface such as a monocrystalline silicon substrate. Regular elements of an integrated circuit 105 such as diodes, bus lines, connecting wirings, and contact pads (not specifically shown) are provided on the silicon substrate surface 104 by conventional silicon IC technique. This IC has a silicon nitride protective film 106. The upper detector level 101 has a silicon nitride protective film 108, a bolometer thin film 109 consisting of, preferably, vanadium oxide or titanium oxide (for example, $V_2O_3$, $TiO_x$, $VO_x$, etc.), namely vanadium or titanium oxide presented by $AB_x$, a silicon oxide protective film 110 formed on the silicon nitride protective film 108 and the bolometer thin film 109, and an infrared absorbing film 111 formed on the silicon nitride protective film 110. This thin protective film (approximately 20 Å in thickness) can be formed by, for example, nickel-iron alloy often called permalloy. A silicon nitride protective film 108' and a silicon nitride protective film 110' formed at the same time as the silicon nitride protective film 108 and the silicon nitride protective film 110 during the manufacturing and extending downward serve as a tilted supporting unit 112 and a tilted supporting unit 112' for the upper detector level 101. A cavity or an air gap 113 (approximately 1 to 2 μm in height) between the two levels is constituted by the ambient air. However, in the manufacturing process, the air gap is initially filled with a readily-soluble material such as soluble glass or other soluble material that is deposited in advance. The soluble material is removed after the silicon nitride protective film 108, the silicon nitride protective film 108', the silicon nitride protective film 110, and the silicon nitride protective film 110' are deposited. Readily-soluble materials other than soluble glass include quartz, polyimide, and resist. In the subsequent process, the glass is fused and removed to obtain a heat-insulating cavity or an air gap (in other words, the air gap actually serves as a vacuum gap). In FIG. 9, the horizontal dimension is presented in a significantly reduced scale. In other words, in FIG. 9, the height is enlarged compared with the horizontal length for showing this structure of related art in detail.

U.S. Pat. No. 5,286,976 has realized high sensitivity in the above thermal isolation structure in which the air gap is set to 1 to 2 μm, particularly to 1.5 μm for the infrared light in a 10 μm wavelength band (8 to 14 μm) for increased absorptance. The reason for increased absorption is described as follows: the incident infrared light is transmitted though the detecting unit suspended in the air and the infrared light reflected upward by the reflective layer and the incident infrared light interfere with each other in the uppermost layer of the detecting unit. Furthermore, the air gap is adjusted so that the uppermost layer is located at a "node."

The SPIE paper (J-L. Tissot et al., Vol. 3379 (1998) pp. 139-144) recites that the air gap (which is termed "the cavity" in the paper) is set to a quarter of a wavelength to be detected, the sheet resistance of the metal thin film of the uppermost layer serving for absorbing infrared light is matched with the vacuum impedance of 377 Ω/square.

Taking into consideration about the description of both the U.S. Pat. No. 5,286,976 and SPIE paper (J-L. Tissot et al., Vol. 3379 (1998) pp. 139-144), the electromagnetic wave of a wavelength to be detected was most efficiently absorbed and the sensitivity was improved in the related art in which the reflective film 107 is formed on the silicon substrate that is the foundation of the thermal isolation structure, the air gap of the thermal isolation structure is set to a quarter of a wavelength to be detected, and the sheet resistance of the metal thin film formed in the uppermost layer of the detecting unit is adjusted to 377 Ω/square.

A review was performed to find out why the air gap was set to 1.5 μm, not to approximately 2.5 μm, for efficiently detecting the infrared light in a 10 μm wavelength band (8 to 14 μm) in an embodiment of the U.S. Pat. No. 5,286,976 of related art. In an embodiment of the U.S. Pat. No. 5,286,976, 90% or higher absorptance is obtained when the air gap is 1.5 μm, the silicon nitride protective film of the detecting unit has a thickness of 350 nm, and the bolometer thin film has a thickness of 75 nm. From the reflection properties of the bolometer thin film and the silicon nitride protective film described in the U.S. Pat. No. 5,286,976, the refractive indices of these films for the infrared light are calculated to be approximately 1.9. Using this value, the optical path length from the top of the reflective layer to the uppermost layer of the detecting unit is calculated to be 2.3 μm, which is very close to 2.5 μm. For this reason, it is thought that the air gap being set to 1.5 μm for detecting the infrared light in a 10 μm wavelength band in the thermal isolation structure of the U.S. Pat. No. 5,286,976 corresponds to the distance between the reflective layer and the uppermost layer of the detector being set to a quarter of a wavelength to be detected.

Various embodiments and changes may be made thereunto without departing from the broad spirit and scope of the invention. The above-described embodiments are intended to illustrate the present invention, not to limit the scope of the present invention. The scope of the present invention is shown by the attached claims rather than the embodiments. Various modifications made within the meaning of an equivalent of the claims of the invention and within the claims are to be regarded to be in the scope of the present invention.

For example, in the above embodiment, a bolometer-type THz wave detector comprising a bolometer thin film as the temperature detecting unit is explained. The present invention is not restricted to the above embodiment. For example, the present invention is also applicable to THz wave detectors comprising an element such as thermoelectric elements such as a thermopile, a diode, and a pyroelectric element as the temperature detecting unit.

Furthermore, in the above embodiment, the second protective film 206, the third protective film 208, and the fourth protective film 210 and the canopy 212 are made of silicon nitride. They can be made of silicon oxide (SiO, $SiO_2$) and silicon oxynitride (SiON) and so on.

A bolometer-type THz wave detector may include a thermal isolation structure in which a supporting unit containing electrode wirings connected to a readout circuit formed in an substrate supports a temperature detecting unit containing a bolometer thin film connected to the electrode wirings so that one face of the temperature detecting unit and the substrate are opposed to each other with a predetermined gap, wherein a reflective film reflecting THz waves is formed on the substrate so as to face the temperature detecting unit, an absorbing film absorbing the THz waves is formed on the temperature detecting unit, the reflective film and temperature detecting unit form an optical resonant structure, the distance between the reflective film and the temperature detecting unit is set to 8 to 14 μm, and the sheet resistance of the absorbing film is set to 100 to 200 Ω/square.

A bolometer-type THz wave detector may include a thermal isolation structure in which a supporting means containing electrode wirings connected to a readout circuit formed in an substrate supports a temperature detecting means containing a bolometer thin film connected to the electrode wirings so that one face of the temperature detecting means and the substrate are opposed to each other with a predetermined gap, wherein a reflective film reflecting THz waves is formed on the substrate so as to face the temperature detecting means, an absorbing film absorbing the THz waves is formed on the temperature detecting means, the reflective film and temperature detecting means form an optical resonant structure, the distance between the reflective film and the temperature detecting means is set to 8 to 14 μm, and the sheet resistance of the absorbing film is set to 100 to 200 Ω/square.

A manufacturing method of a bolometer-type THz wave detector may include a thermal isolation structure in which a supporting unit containing electrode wirings connected to a readout circuit formed in an substrate supports a temperature detecting unit containing a bolometer thin film connected to the electrode wirings so that one face of the temperature detecting unit and the substrate are opposed to each other with a predetermined gap, wherein a reflective film reflecting THz waves is formed on the substrate so as to face the temperature detecting unit, an absorbing film absorbing the THz waves is formed on the temperature detecting unit, the reflective film and temperature detecting unit form an optical resonant structure, the distance between the reflective film and the temperature detecting unit is set to 8 to 14 μm, and the sheet resistance of the absorbing film is set to 100 to 200 Ω/square.

Furthermore, a canopy extending outward from the periphery of the temperature detecting unit may be formed on the temperature detecting unit, the absorbing film may be formed on the temperature detecting unit and on the canopy, the distance between the reflective film and the temperature detecting unit and the distance between the reflective film and the canopy may be set to 8 to 14 μm, and the sheet resistance of the absorbing film may be set to 100 to 200 Ω/square.

The distance between the reflective film and the temperature detecting unit and the sheet resistance may be set so that the absorptance for THz waves in a wavelength range from 30 to 300 μm is 20% or higher.

The canopy may be made of silicon nitride.

The bolometer-type THz wave detector of the preset invention can solve the foregoing circumstance with the related art (the thermal isolation structure has a low THz wave absorptance, for example, 18 to 40% for a wavelength of 100 μm (3 THz) and 5 to 10% for a wavelength of 300 μm (1 THz)) by setting the distance between the reflective film and the temperature detecting unit (the absorbing film) and the distance between the reflective film and the canopy to 8 μm to 14 μm and setting the sheet resistance of the absorbing film on the temperature detecting unit to 100Ω to 200 Ω.

In other words, application of the present invention leads the THz wave absorptance for a wavelength of 100 μm to 65% to 90% and the THz wave absorptance for a wavelength of 300 μm to 25% to 45%. This corresponds to the sensitivity approximately 2.5 times higher to a wavelength of 100 μm and approximately 4.5 times higher to a wavelength of 300

μm. Application of the present invention also achieves several times higher sensitivity to wavelengths other than these two wavelengths (100 μm and 300 μm) than the sensitivity obtained by the related art.

The present invention is usable in detectors detecting THz waves in a wavelength range approximately from 30 μm to 1 mm.

Having described and illustrated the principles of this application by reference to one or more preferred embodiments, it should be apparent that the preferred embodiment(s) may be modified in arrangement and detail without departing from the principles disclosed herein and that it is intended that the application be construed as including all such modifications and variations insofar as they come within the spirit and scope of the subject matter disclosed herein.

What is claimed is:

1. A THz wave detector comprising a thermal isolation structure in which a supporting unit containing electrode wirings connected to a readout circuit formed in a substrate supports a temperature detecting unit connected to said electrode wirings so that one face of said temperature detecting unit and said substrate are opposed to each other with a predetermined gap, wherein:
    a reflective film reflecting THz waves is formed on said substrate so as to face said temperature detecting unit, an absorbing film absorbing said THz waves is formed on said temperature detecting unit, and said reflective film and said temperature detecting unit form an optical resonant structure; and
    the distance between said reflective film and said temperature detecting unit is set to 8 to 14 μm and the sheet resistance of said absorbing film is set to 100 to 200 Ω/square.

2. The THz wave detector according to claim 1 wherein a canopy extending outward from the periphery of said temperature detecting unit is formed on said temperature detecting unit, said absorbing film is formed on said temperature detecting unit and on said canopy, the distance between said reflective film and said temperature detecting unit and the distance between said reflective film and said canopy are set to 8 to 14 μm and the sheet resistance of said absorbing film is set to 100 to 200 Ω/square.

3. The THz wave detector according to claim 1 wherein said temperature detecting unit includes a bolometer thin film connected to said electrode wirings.

4. The THz wave detector according to claim 2 wherein said temperature detecting unit includes a bolometer thin film connected to said electrode wirings.

5. The THz wave detector according to claim 1 wherein said distance and said sheet resistance are set so that the absorptance for THz waves in a wavelength range from 30 to 300 μm is 20% or higher.

6. The THz wave detector according to claim 2 wherein said distance and said sheet resistance are set so that the absorptance for THz waves in a wavelength range from 30 to 300 μm is 20% or higher.

7. The THz wave detector according to claim 3 wherein said distance and said sheet resistance are set so that the absorptance for THz waves in a wavelength range from 30 to 300 μm is 20% or higher.

8. The THz wave detector according to claim 4 wherein said distance and said sheet resistance are set so that the absorptance for THz waves in a wavelength range from 30 to 300 μm is 20% or higher.

9. The THz wave detector according to claim 2 wherein said canopy is made of silicon nitride.

10. The THz wave detector according to claim 4 wherein said canopy is made of silicon nitride.

11. The THz wave detector according to claim 6 wherein said canopy is made of silicon nitride.

12. The THz wave detector according to claim 8 wherein said canopy is made of silicon nitride.

13. A THz wave detector comprising a thermal isolation structure in which a supporting means containing electrode wirings connected to a readout circuit formed in a substrate supports a temperature detecting means connected to said electrode wirings so that one face of said temperature detecting means and said substrate are opposed to each other with a predetermined gap, wherein:
    a reflecting means reflecting THz waves is formed on said substrate so as to face said temperature detecting means, an absorbing means absorbing said THz waves is formed on said temperature detecting means, and said reflective means and said temperature detecting means form an optical oscillation means; and
    the distance between said reflective means and said temperature detecting means is set to 8 to 14 μm and the sheet resistance of said absorbing means is set to 100 to 200 Ω/square.

14. A manufacturing method of a THz wave detector comprising a thermal isolation structure in which a supporting unit containing electrode wirings connected to a readout circuit formed in a substrate supports a temperature detecting unit connected to said electrode wirings so that one face of said temperature detecting unit and said substrate are opposed to each other with a predetermined gap, wherein:
    a reflective film reflecting THz waves is formed on said substrate so as to face said temperature detecting unit, an absorbing film absorbing said THz waves is formed on said temperature detecting unit, and said reflective film and said temperature detecting unit form an optical resonant structure; and
    the distance between said reflective film and said temperature detecting unit is set to 8 to 14 μm and the sheet resistance of said absorbing film is set to 100 to 200 Ω/square.

* * * * *